United States Patent [19]
Nakajima

[11] Patent Number: 5,886,380
[45] Date of Patent: Mar. 23, 1999

[54] SEMICONDUCTOR MEMORY ELEMENTS HAVING QUANTUM BOX FLOATING GATES

[75] Inventor: Anri Nakajima, Kawasaki, Japan

[73] Assignee: Fujitsu Limited, Kawasaki, Japan

[21] Appl. No.: 819,633

[22] Filed: Mar. 17, 1997

[30] Foreign Application Priority Data

Mar. 19, 1996 [JP] Japan ..................................... 8-063441
Dec. 5, 1996 [JP] Japan ..................................... 8-325487

[51] Int. Cl.⁶ .......................... H01L 29/788; H01L 29/06
[52] U.S. Cl. ................................ 257/321; 257/9; 257/24; 257/347
[58] Field of Search .................................. 257/9, 20, 38, 257/24, 316, 321, 347; 365/185.1

[56] References Cited

U.S. PATENT DOCUMENTS

| | | | |
|---|---|---|---|
| 5,600,163 | 2/1997 | Yano et al. .............................. | 257/314 |
| 5,691,552 | 11/1997 | Oyama ..................................... | 257/316 |
| 5,714,766 | 2/1998 | Chen et al. ............................... | 257/17 |

*Primary Examiner*—John Guay
*Attorney, Agent, or Firm*—Armstrong, Westerman, Hattori, McLeland & Naughton

[57] ABSTRACT

A substrate has an insulating surface; a fine wire region disposed on the insulating surface of the substrate and extending long in one direction; a first insulating film formed on the fine wire region at least at a partial area along the longitudinal direction of the fine wire region; and a first micro box region formed on the first insulating film over the fine wire region at a partial area along the longitudinal direction of the fine wire region a semiconductor device. The semiconductor device has a fine wire region and a micro box region to realize control of a single electron level. The manufacturing method for the semiconductor device is also disclosed.

18 Claims, 9 Drawing Sheets

SEMICONDUCTOR MEMORY ELEMENTS HAVING QUANTUM BOX FLOATING GATES

BACKGROUND OF THE INVENTION

1. Field of the Invention

The present invention relates to a semiconductor device and its manufacture, and more particularly to a semiconductor device and its manufacture suitable for achieving control of a single electron level by using a micro box region such as a quantum box.

2. Description of the Related Art

Studies have been made on the technology of making a quantum box capable of quantum confinement of an electron by reducing the size of a semiconductor region to the order of nanometers. Studies heretofore have been focussed on reducing the size of a semiconductor region and making the size uniform, however, control of a position of a quantum box has been mostly ignored. This tendency is also true for semiconductor devices having other micro regions like a quantum box.

If a micro box region such as a quantum box can be formed precisely at a desired position of micro box regions, the application to fields of semiconductor devices can be broadened. In particular, if the relative positions of a fine wire region and a micro box region can be controlled reliably, applications to semiconductor devices which perform various controls of a single electron level become possible.

SUMMARY OF THE INVENTION

It is an object of the present invention to provide a semiconductor device having a fine wire region and a micro box region capable of achieving control of a single electron level.

It is another object of the present invention to provide a method of manufacturing a semiconductor device having a fine wire region and a micro box region capable of achieving control of a single electron level.

According to one aspect of the present invention, there is provided a semiconductor device comprising: a substrate having an insulating surface; a fine wire region made of a semiconductor material, elongated along one direction, and disposed on the insulating surface of the substrate; a first insulating film formed on the fine wire region at least at a partial area along the longitudinal direction of the fine wire region; and a first micro box region formed on the first insulating film over the fine wire region at a partial area along the longitudinal direction of the fine wire region.

By capturing an electron in the micro box region, a potential of the micro box region relative to the nearby fine wire region can be changed.

According to another aspect of the present invention, there is provided a method of manufacturing a semiconductor device, comprising the steps of: preparing a laminated substrate including a lower semiconductor layer, a first insulating layer, and an upper semiconductor layer formed in this order on an underlying substrate having an insulating surface; forming a first mask pattern on the upper semiconductor layer, the first mask pattern including a fine wire pattern for forming a narrow stripe pattern extending in a first direction; etching the upper semiconductor layer, first insulating layer, and lower semiconductor layer by using the first mask pattern as a mask, to form a fine wire-shaped laminated structure including a fine wire region of the lower semiconductor layer, said first insulating layer and upper semiconductor layer left in a narrow stripe shape formed on and along said fine wire region, at the area covered with the fine wire pattern of the first mask pattern; removing the first mask pattern; forming a second mask pattern on the surface of the substrate, the second mask pattern including an elongated pattern for forming a narrow stripe pattern extending in a second direction crossing the first direction; etching the upper semiconductor left in a narrow stripe shape by using the second mask pattern as a mask, to form a micro box region of the upper semiconductor layer at a cross area of the fine wire region and the second mask pattern; and removing the second mask pattern.

The micro box region can be formed over the fine wire region, with an insulating film being interposed therebetween. The position of the micro box region can be determined in a self-alignment manner along the direction crossing the micro wire region.

A quantum box over the quantum wire via an insulating film can be formed. By forming a gate electrode over the quantum box via an insulating film, a floating dot type single electron memory can be realized.

A quantum wire having a wide quantum wire portion and a quantum box or gate electrode over the wide quantum wire portion via an insulating film can be formed. By controlling a voltage applied to the gate electrode, electrons moving in the quantum wire can be controlled in the unit of a single electron.

DETAILED DESCRIPTION OF THE PREFERRED EMBODIMENTS

Although semiconductor devices having quantum wires and quantum boxes will be described mainly hereinbelow, these are only detailed examples and the invention is not limited to these devices.

Figure 1A:
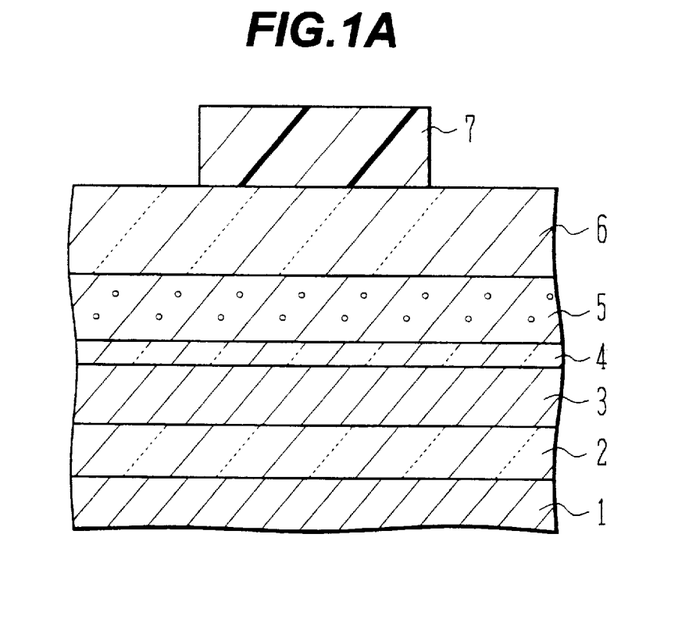
FIGS. 1A and 1B are cross sectional views illustrating a manufacture method of a quantum wire and a quantum box according to an embodiment of the invention.
Figure 1B:
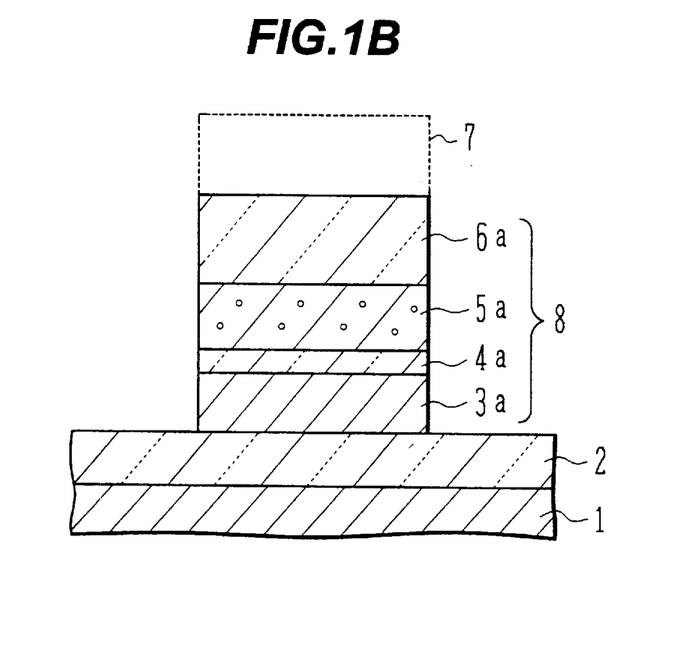
Figure 2A:
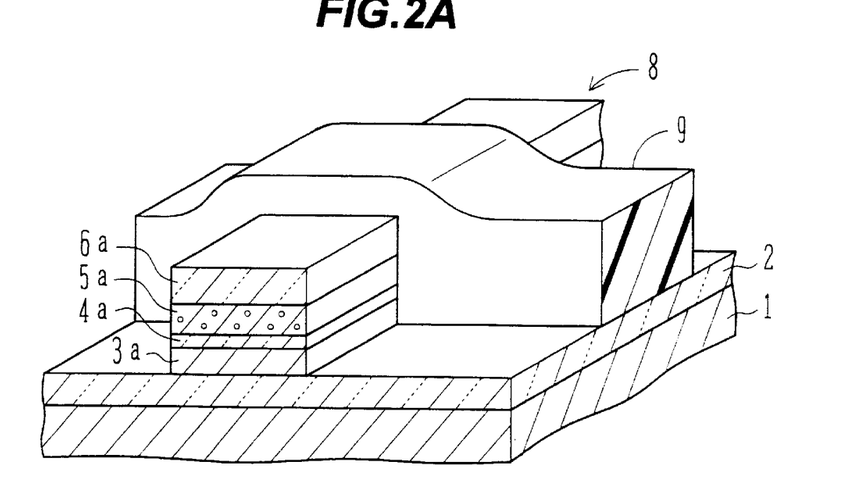
FIGS. 2A to 2C are partially broken perspective views of a laminated substrate, illustrating the manufacture method of a quantum wire and a quantum box according to the embodiment.
Figure 2B:
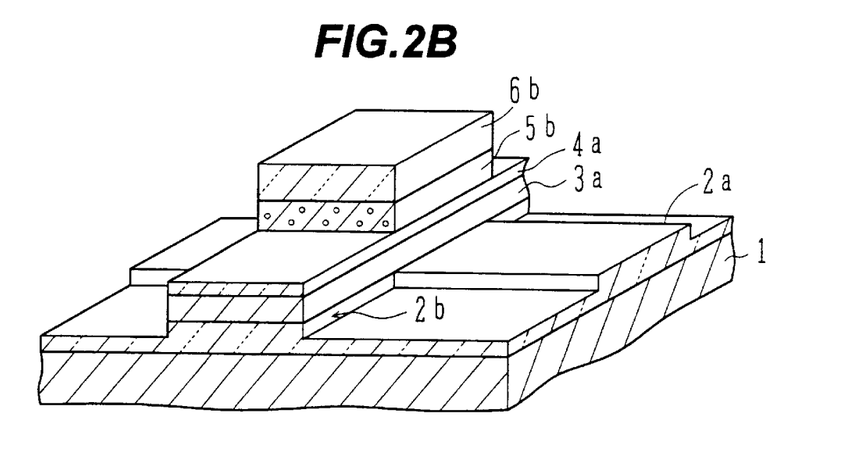
Figure 2C:
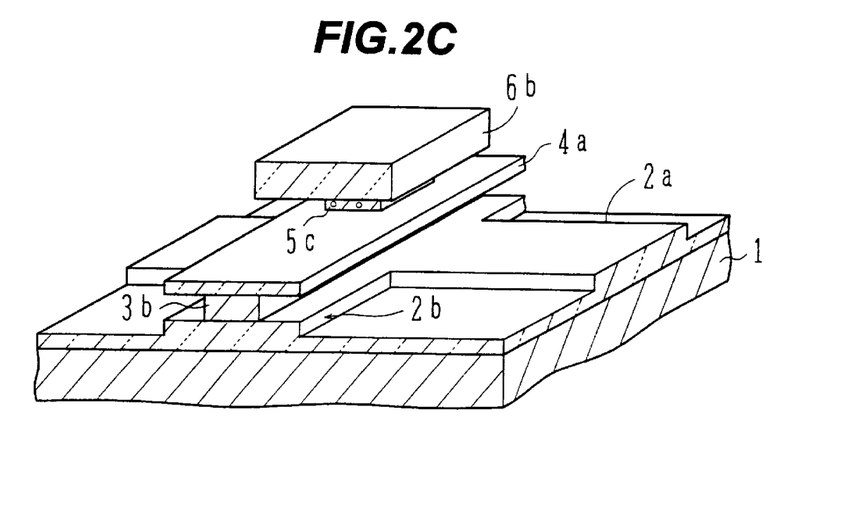

A method of manufacturing a quantum wire and a quantum box according to an embodiment of the invention will be described with reference to FIGS. 1A and 2B and FIGS. 2A to 2C. FIGS. 1A and 1B are cross sectional views of a substrate, and FIGS. 2A to 2C are perspective views of a substrate.

As shown in FIG. 1A, a SIMOX (separation by implanted oxygen) substrate is prepared which has an underlying substrate 1, a single crystal silicon thin film 3, and a buried oxide film 2 formed between the substrate 1 and thin film 3. The thickness of the buried oxide film 2 is 400 nm and that of the silicon thin film 3 is 30 nm. The surface of the silicon thin film 3 is thermally oxidized in a dry oxygen atmosphere for about 35 minutes at a temperature of 800° C. to form a thermally oxidized $SiO_2$ film 4 of about 5 nm thick on the surface of the silicon thin film 3. After the thermal oxidation, the thickness of the silicon thin film 3 becomes about 28 nm.

Polysilicon (polycrystalline silicon) is deposited on the thermally oxidized $SiO_2$ film 4 by low pressure chemical vapor deposition (LPCVD) under the conditions of a pressure of 30 Pa, a growth temperature of 620° C., and a flow rate of 500 sccm of source gas which is mixed gas of silane ($SiH_4$) and helium (He) at a volume ratio of 1:4. Polysilicon is grown for about 3.5 minutes under the above conditions to form a polysilicon film 5 of about 25 nm.

$SiO_2$ is deposited on the polysilicon film 5 by chemical vapor deposition (CVD) under the conditions of a growth temperature of 800° C. by using source gas of mixed gas of $SiH_4$ and He at a volume ratio of 1:4 and a flow rate of 225 sccm and $N_2O$ at a flow rate of 2000 sccm. $SiO_2$ is grown under the above conditions for about 8.3 minutes to form an $SiO_2$ film 6 of about 20 nm.

A resist film for electron beam exposure is coated on the surface of the $SiO_2$ film 6. Resist may be CMS (M075) manufactured by Tosoh Corporation and the thickness is set to 70 nm. Thereafter, the resist is exposed through a direct electron beam exposure to form a narrow stripe resist pattern 7 having a width of 70 nm and a length of 200 nm. Electron beam exposure is performed, for example, under the conditions of a dose of 170 $\mu C/cm^2$ and an acceleration energy of 30 keV.

As shown in FIG. 1B, by using the resist pattern 7 as a mask, the layers from the $SiO_2$ film 6 to silicon thin film 3 are etched. For example, for etching the $SiO_2$ film, anisotropic reactive ion etching (RIE) is performed using mixed gas of $CHF_3$, $CF_4$ and Ar as etching gas, and for etching the polysilicon film 5 and silicon thin film 3, anisotropic RIE is performed using mixed gas of Hbr and He as etching gas. With this etching processes, a narrow stripe pattern 8 is formed which is a lamination of a single crystal silicon film 3a, an $SiO_2$ film 4a, a polysilicon film 5a, and an $SiO_2$ film 6a. The resist pattern 7 is thereafter removed.

As shown in FIG. 2A, a resist pattern 9 is formed, extending in the direction crossing the longitudinal direction of the narrow stripe pattern 8. For example, patterns 8 and 9 are orthogonal. The resist material may be the same as that of the resist pattern 7 shown in FIG. 1A. The resist material is used to coat the narrow strip pattern 8 to make a resist film having a thickness of about 70 nm above the narrow stripe pattern 8 and about 150 nm to sides of the narrow strip pattern 8. The thus made resist film is patterned by electron beam exposure and development to form the resist pattern 9. This electron beam exposure is performed, for example, at a dose of 400 $\mu C/cm^2$ and an acceleration energy of 30 keV.

By using the resist pattern 9 as a mask, the $SiO_2$ film 6a formed in a narrow stripe pattern is etched by anisotropic RIE similar to that used for the process of FIG. 1B. At this time, the surface layer of the buried oxide film 2 is slightly etched at the area not covered with the narrow stripe pattern 8 and resist pattern 9.

As shown in FIG. 2B, a very small square $SiO_2$ film 6b having a side length of about 70 nm is left at the area where the narrow stripe pattern 8 is covered with the resist pattern 9.

Since the exposed surface area of the buried oxide film 2 is slightly etched, a stripe protrusion 2a is formed at the area covered with the resist pattern 9 and a step 2b is formed just under the side walls of the narrow stripe pattern 8.

Returning back to FIG. 2A, the polysilicon film 5 formed in the narrow stripe pattern is etched by anisotropic RIE similar to that used for the process of FIG. 1B.

As shown in FIG. 2B, a polysilicon film 5b having generally the same plan shape as the very small $SiO_2$ film 6b is formed just under the $SiO_2$ film 6b. The resist pattern 9 is thereafter removed.

The silicon film 3a formed in the narrow stripe pattern and the polysilicon film 5b formed in the square shape are laterally etched from the side walls thereof, by using etchant of $NH_4OH$, $H_2O_2$, and $H_2O$ mixed at a volume ratio of 2:3:8. Under the conditions of a temperature of 70° C. using this etchant, an etching rate is about 4 nm per 10 minutes. The etching is performed for about 50 minutes under these conditions.

As shown in FIG. 2C, the width of the silicon film 3a is narrowed and a quantum wire 3b of about 30 nm wide is formed, and the plan shape of the polysilicon film 5b is reduced to form a quantum box 5c having a side length of about 30 nm. If a sufficiently narrow quantum wire and a sufficiently small quantum box can be obtained by the processes up to FIG. 2B, the lateral etching may be omitted by changing the pattern sizes to desired values. Impurities are doped, if necessary, into the quantum wire, quantum box, etc. For example, ions are implanted in the state shown in FIG. 2B where the resist pattern is removed after etching.

The uppermost $SiO_2$ film 6 may be dispensed with.

In this specification, a quantum wire means a very thin wire capable of two-dimensional quantum confinement of a motion (probability of presence) of electrons or holes. For example, quantum confinement is possible if the width and height of a very fine wire are set to 5 nm to 100 nm. A quantum box means a box capable of three-dimensional quantum confinement of a motion of electrons or holes. For example, quantum confinement is possible if a box has a size capable of being contained in a sphere of 100 nm diameter.

In this specification, the term "quantum box" is used also for such a micro box region that enables observation of energy quantization by a Coulomb blockade effect.

After the lateral etching, an $SiO_2$ film of about 5 nm thick may be formed on the exposed surfaces of the quantum wire and box by thermal oxidation for about 35 minutes at a temperature of about 800° C. The oxidized exposed surfaces reduce the effects of surface levels or the like and reduces the size of the quantum wire and box. For example, the width of the quantum wire is narrowed from 30 nm to about 25 nm and the area of the quantum box is reduced from a 30 nm square to about a 25 nm square.

As shown in FIGS. 1A and 1B and FIGS. 2A to 2C, the quantum box can be formed above the quantum wire via the insulating film. The position of the quantum box in the longitudinal direction of the quantum wire is determined by positional alignment of the resist pattern 9 at the process of FIG. 2A. The position of the quantum box in the width direction crossing the quantum wire is determined when the narrow stripe pattern 8 is formed at the process of FIG. 1B so that the position of the quantum box is self-aligned with the position of the quantum wire.

Figure 3A:
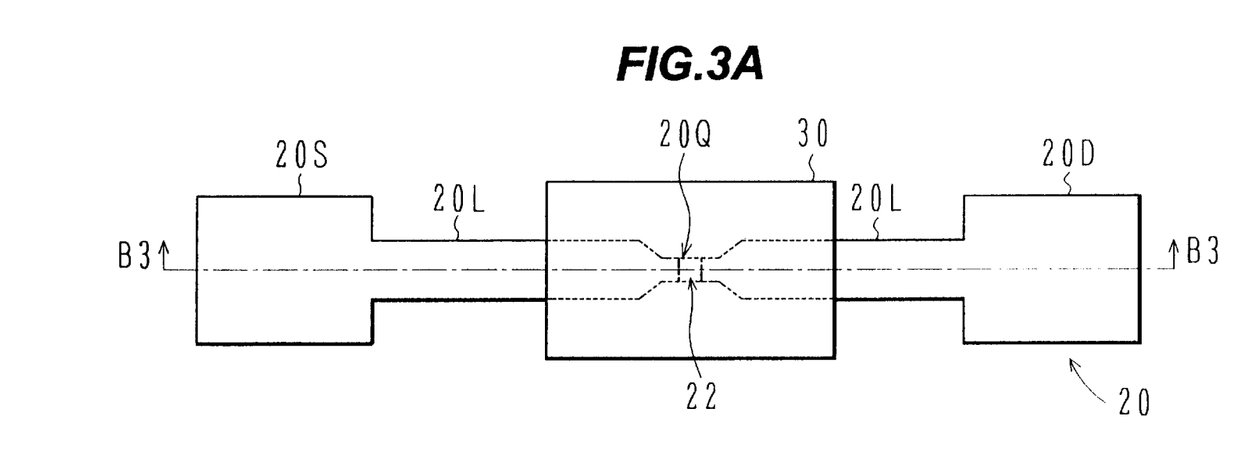
FIGS. 3A and 3B are a plan view and a cross sectional view of a floating dot type single electron memory using a quantum wire and a quantum box formed by the embodiment method illustrated in FIGS. 1A to 2C.
Figure 3B:
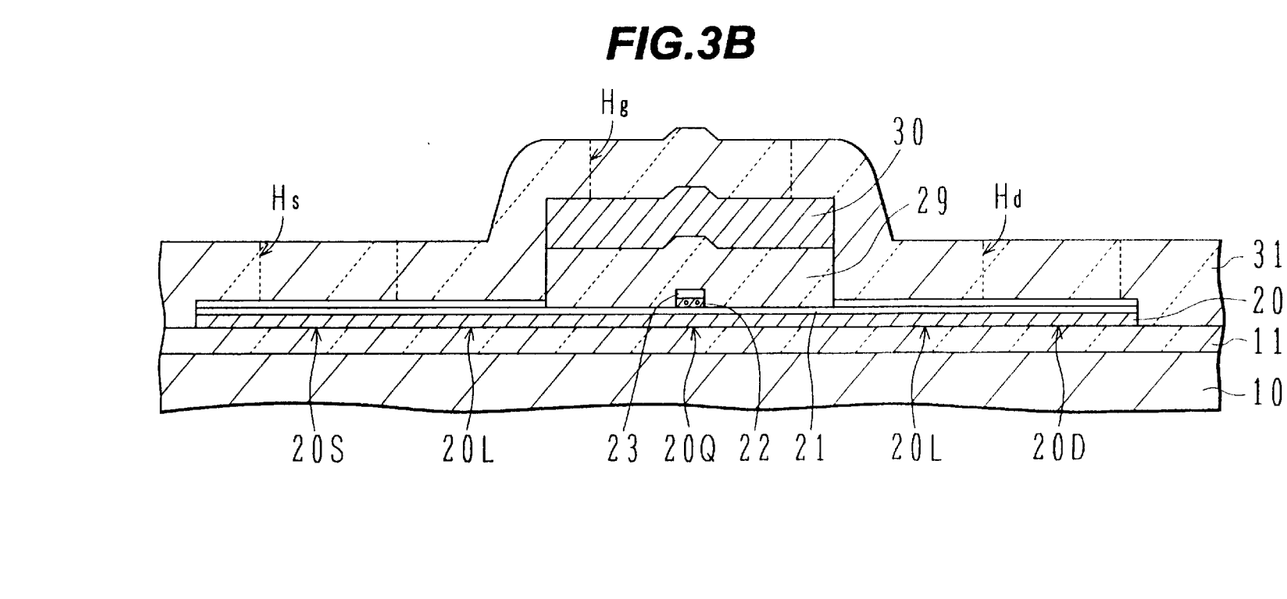

FIGS. 3A and 3B show the structure of a floating dot type silicon single electron memory manufactured by the above method of forming a quantum wire and a quantum box. FIG. 3A is a plan view, and FIG. 3B is a cross sectional view taken along one-dot chain line B3—B3 of FIG. 3A. "Single electron" implies two discrete energy states discriminated by a presence/absence of one electron. In the context of practical operations, single electron devices include not only a device transferring one electron but also a device transferring several electrons.

As shown in FIG. 3A, source and drain regions 20S and 20D of n-type thin film silicon are coupled by a pair of n-type silicon wiring layers 20L and a quantum wire 20Q disposed at the center of the silicon wiring layers 20L in the lateral direction. The width and length of the quantum wire 20Q are about 70 nm and 200 nm, respectively. A square quantum box 22 made of polysilicon and having a side length of about 70 nm is formed at approximately the central area of the quantum wire, with an insulating layer 21 interposed therebetween. A gate electrode 30 made of amorphous or polycrystalline silicon is disposed at a predetermined area over the quantum wire 20 Q and quantum box 22, with an upper gate insulating film 29 being interposed.

The cross sectional structure of the silicon single crystal memory will be described with reference to FIG. 3B. On a silicon substrate 10, a buried oxide film 11 is formed on which film 11 a patterned silicon film 20 of about 30 nm thick is formed. This silicon film 20 is constituted of the quantum wire 20 Q, the pair of silicon wiring layers 20L connected to the quantum wire, and source and drain regions 20S and 20D connected to the pair of silicon wiring layers 20L.

The quantum box 22 made of polysilicon and having a thickness of about 25 nm is formed over the quantum wire 20Q with a gate $SiO_2$ film 21 being interposed. Over the quantum box 22, an $SiO_2$ film 23 of about 20 nm thick is formed. The structure described so far can be formed by the same methods as used for the processes of FIGS. 1A and 1B and FIGS. 2A and 2B. The first patterning process described with FIGS. 1A and 1B is performed by using a resist film pattern matching the shape of the silicon film pattern 20. After the process described with FIG. 2B, the etching process described with FIG. 2C is performed if necessary to reduce the size of the quantum wire 20Q and quantum box 22.

Next, an $SiO_2$ film of about 200 nm is deposited over the whole surface of the substrate by CVD. If there are recesses etched under the $SiO_2$ films 21 and 23 (respectively corresponding to $SiO_2$ films 4a and 6b in FIG. 2C), these recesses are buried with the CVD $SiO_2$ film. On this $SiO_2$ film, an amorphous silicon film of 160 nm thick is deposited by resistance heating evaporation. Alternatively, a polycrystalline silicon film may be deposited by low pressure chemical vapor deposition (LPCVD).

$P^+$ ions are implanted into the amorphous or polycrystalline silicon film under the conditions of a dose of $4\times10^{15}$ $cm^{-2}$ and an acceleration energy of 20 keV to impart conductivity to the amorphous or polycrystalline silicon film.

The $SiO_2$ film and amorphous or polycrystalline silicon film are patterned to respectively form the $SiO_2$ gate insulating film 29 covering the quantum wire 20Q and quantum box 22 and to form the amorphous or polycrystalline silicon gate electrode 30. This etching is stopped when a thin gate insulating film is left on the silicon wiring layers 20L and source/drain regions 20S and 20D in order to assuredly leave the silicon film 20. At the final stage of this etching, wet etching may be performed in order to assuredly leave the source/drain regions 20S and 20D. The figure shows a state where this wet etching is not employed.

After the main part of the etching or the whole part of the etching is completed, n-type impurity doping to the source/drain regions is done by implanting As ions at an acceleration energy of 20 KeV at a dose of $4\times10^{15}$ $cm^{-2}$.

An interlayer insulating film 31 of $SiO_2$ is deposited covering the whole surface of the substrate. Thereafter, a contact hole Hg exposing the gate electrode 30 at a position displaced to the side from the location of the quantum wire and the quantum box, a contact hole Hs exposing the source region 20S, and a contact hole Hd exposing the drain region 20D are formed by photolithography or electron beam lithography and selective etching.

Thereafter, wiring layers for the gate electrode 30, source region 20S, and drain region 20D are formed. If necessary, another interlayer insulating film and a higher level wiring layer are formed and an insulating cover layer is formed over the whole surface of the substrate. With the above processes, the quantum box in an electrically floating state is formed over the quantum wire, and the gate electrode is formed over the quantum box to complete the single electron memory.

Next, the operation of the floating dot type silicon single electron memory shown in FIGS. 3A and 3B will be described.

As the source region 20S is grounded, the drain region 20D is applied with a drain voltage, and a gate voltage higher than a threshold value is applied to the gate electrode 30, a channel is formed in the quantum wire 20Q and silicon wiring layers 20L and a drain current flows between the source regions 20S and drain region 20D. If a gate voltage lower than the threshold value is applied, the silicon wiring layers 20L and quantum wire 20Q are depleted so that the drain current will not flow. If electron or electrons in the quantum wire and quantum box are in a quantized state, current flows if the energy levels in the current path coincide with each other.

As a predetermined large positive voltage is applied to the gate electrode 30, an electron moves from the quantum wire 20Q to the quantum box 22 by tunneling. As an electron moves to the quantum box 22, the next electron cannot move to the quantum box 22 because of the Coulomb blockade effect. In this way, one or a few electrons are captured in the quantum box 22. As the electron is captured in the quantum box 22, the quantum wire 20Q under the quantum box becomes likely to be depleted and the threshold voltage rises. The characteristics of the single electron memory change with the presence/absence of an electron captured in the quantum box. This change in the characteristics can be utilized as a memory. For example, a presence/absence of charges can be detected in accordance with an absence/presence of a drain current when a plus 20V is applied to the gate electrode. The threshold voltage can be reduced by reducing the thickness of the gate insulating layer 29.

As a large negative voltage is applied to the gate electrode 30, the electron captured in the quantum box 22 moves to the quantum wire 20Q and the initial threshold value is recovered. When necessary, an electron is again injected to the quantum box.

In the above manner, one bit information can be memorized as a change in the threshold voltage by injecting an electron into the quantum box or repelling it from the quantum box. If the retention time of electrons in the quantum box is sufficiently long, a non-volatile memory can be realized.

Next, a semiconductor device according to another embodiment will be described with reference to FIGS. 4A and 4B. In the previous embodiment, the polysilicon film 5a and $SiO_2$ film 6a patterned in the narrow stripe pattern are etched by anisotropic RIE. In the embodiment shown in FIGS. 4A and 4B, etching accompanied with side etching nature is used. An example is etching $SiO_2$ with $CF_4+CHF_3+Ar$, and etching Si with HBr+He. When the polysilicon film 5a or $SiO_2$ film 6a in FIG. 2A is etched with some side etching the silicon film 3a or $SiO_2$ film 4a disposed below and having side walls exposed also side-etched.

Figure 4A:
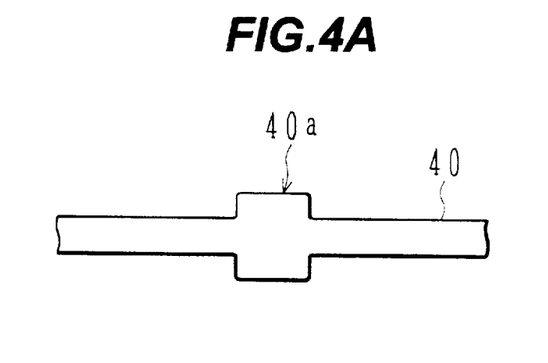
FIG. 4A is a plan view showing the pattern of a quantum wire according to another embodiment of the invention.

FIG. 4A is a plan view of a quantum wire formed by side-etching the polysilicon film 3a and $SiO_2$ film 4a of FIG. 2A. As shown in FIG. 2A, since the side walls of the silicon film 3a and $SiO_2$ film 4a where the quantum box is formed are covered with the resist pattern 9, side etching does not occur. Therefore, as shown in FIG. 4A, a quantum wire 40 having a wide area 40a is formed.

Since the energy levels are discontinuous at the boundaries between the wide area 40a and the small areas, the quantum wire 40 functions as if potential barriers formed at both sides of the wide area 40a.

Figure 4B:
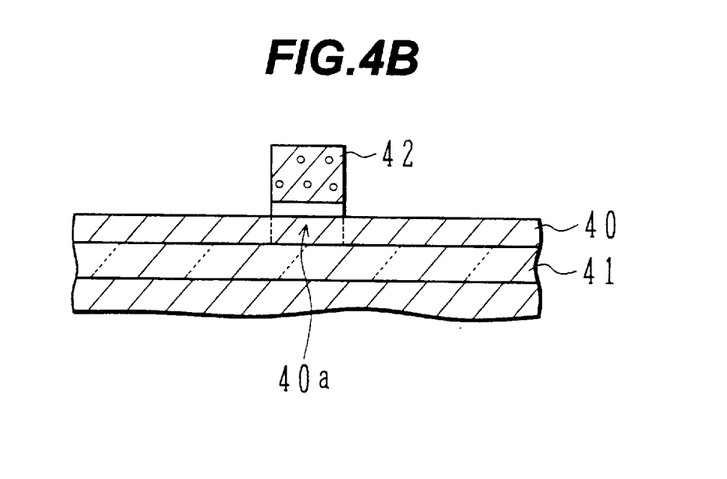
FIG. 4B is a cross sectional view of a three-terminal device using the quantum wire shown in FIG. 4A.

FIG. 4B is a cross sectional view of a semiconductor device according to another embodiment. A quantum wire 40 is formed on a buried oxide film 41. A gate electrode 42 is disposed over a wide area 40a of the quantum wire 40, with an insulating film being interposed therebetween. The gate electrode 42 is formed, for example, by the same method as that of forming the quantum box 5b described with FIGS. 2A and 2B. With this method, the relative positions of the gate electrode 42 and wide area 40a can be self-aligned in the plane of the substrate.

A quantum box may be disposed in a self-alignment manner instead of the gate electrode 42.

As a voltage applied to the gate electrode is changed, the energy level at the wide area 40a also changes because of the applied electric field. If the energy level at the wide area 40a coincides with the energy level at the narrow areas on both sides of the wide area 40a, current flows, whereas if not, current will not flow.

Therefore, as the voltage applied to the gate electrode is changed, current peaks appear discretely. It is therefore possible to form a three-terminal element capable of controlling the motion of a single electron.

In the above embodiments, one layer of the quantum box 5c is formed over the quantum wire 3b, such as is shown in FIG. 2C. A plurality of layers of quantum boxes may be formed.

Figure 5:
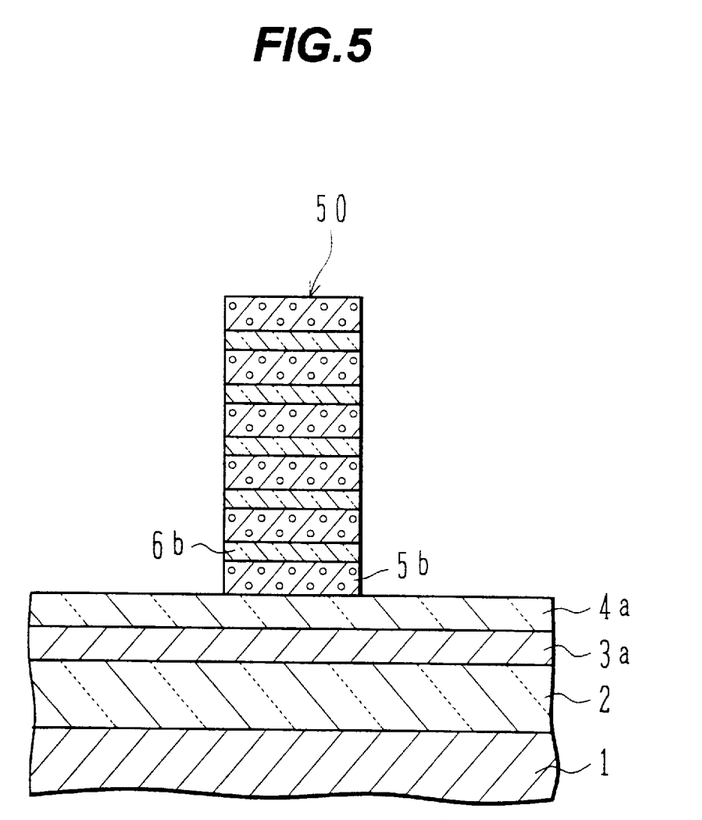
FIG. 5 is a cross sectional view of a lamination structure of a quantum wire and quantum boxes disposed in the height direction.

FIG. 5 shows a lamination structure of a plurality of layers of quantum boxes disposed over a quantum wire, and corresponds to the cross sectional view of FIG. 2B taken along the longitudinal direction of the quantum wire 3a. On a quantum box 5b of polysilicon and an insulating film 6b of $SiO_2$, a plurality of quantum boxes of polysilicon and insulating films of $SiO_2$ are alternately laminated to form a mesa structure 50 having the quantum boxes aligned in the thickness direction of the substrate. An effective resistance from the quantum wire to the uppermost quantum box serving as a floating dot for storing charge, becomes large and a memory having a long retention time can be realized.

In forming the mesa structure 50 shown in FIG. 5, a substrate with a plurality of alternately laminated polysilicon films 5 and $SiO_2$ films 6 is prepared in the process shown in FIG. 1A. At the etching steps shown in FIGS. 2A and 2B, the polysilicon films and insulating films are repetitively etched down to the lowermost polysilicon layer 5b. In this manner, the mesa structure shown in FIG. 5B can be formed.

Similar to the embodiment shown in FIG. 3, after the quantum wire and box are formed, the gate electrode is formed over the quantum box. The gate electrode may be formed at the same time when the quantum box is formed.

Figure 6A:
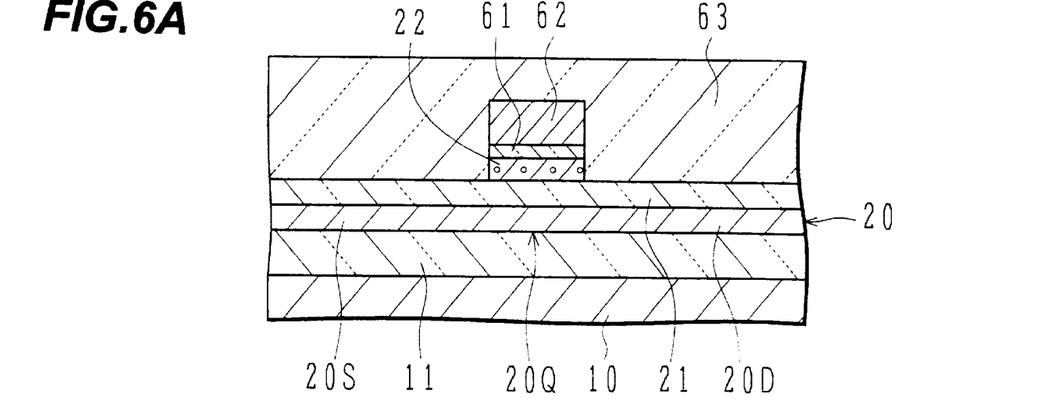
FIGS. 6A to 6C are cross sectional views of a laminated substrate illustrating a manufacture method of a quantum wire and a quantum box according to another embodiment of the invention.
Figure 6B:
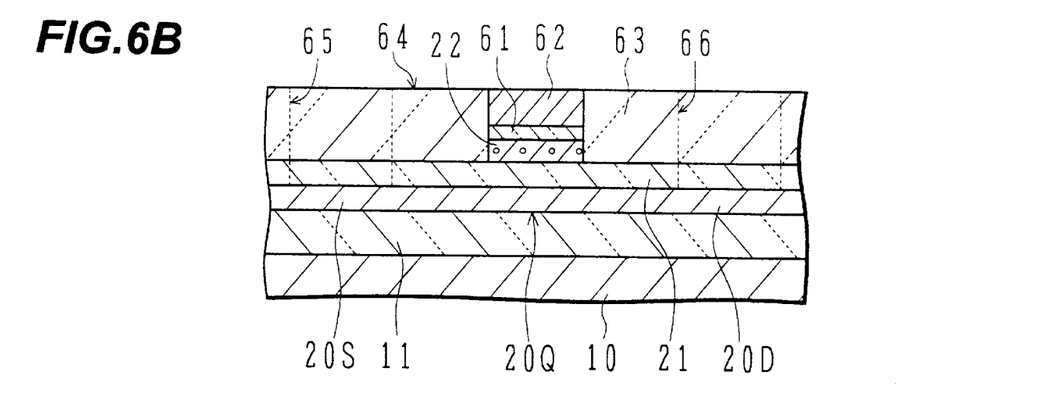
Figure 6C:
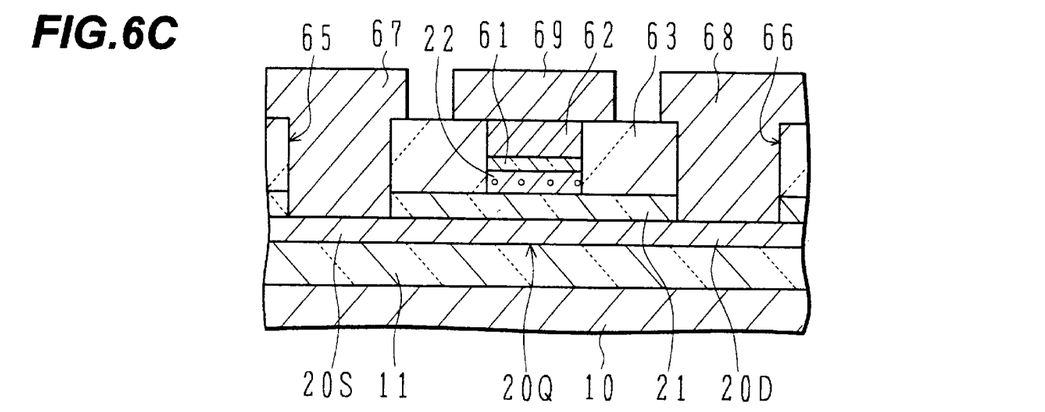

FIGS. 6A to 6C illustrate the structure and manufacturing method of a floating dot type single electron memory according to another embodiment of the invention.

As shown in FIG. 6A, a SIMOX substrate is used which has a silicon oxide film 11 and a single crystal silicon thin film 20 formed on the surface of an p-type single crystal silicon substrate 10. The surface of the silicon thin film 20 is oxidized to form a silicon oxide film 21. On the surface of the silicon oxide film, a polysilicon layer 22 and a silicon oxide layer 61 are deposited. These processes are the same as those described with FIG. 1A. On the silicon oxide film 61, a metal layer 62 is formed. The metal layer 62 may be made of W, Pt, Au, Al, Ag, Cu, Ta, or the like. The metal layer 62 is formed by sputtering, CVD, or the like. The metal layer 62 is a layer to which a control voltage is applied, and the thickness thereof can be determined as desired. A semiconductor layer may be used in place of the metal layer 62.

Thereafter, the processes as described with FIGS. 1A to 2C are performed to form a narrow column including the quantum box 22 placed on a structure of the narrow stripe silicon thin layer 20 and silicon oxide film 21. The silicon thin film 20 has a shape similar to the silicon thin film shown in FIG. 3A and is constituted of a source region 20S, a drain region 20D, and a quantum wire region 20Q.

Thereafter, the surface of the substrate with such a structure is buried with an insulating layer 63. The insulating layer 63 is, for example, a combination of a CVD film and an SOG film having the planarized surface. Instead of the SOG film, a tetraethylorthosilicate (TEOS)—ozone CVD film may be used, or a borophosphosilicate glass (BPSG) film once formed may be reflowed to planarize its surface.

As shown in FIG. 6B, the surface of the insulating film 63 is polished to expose the surface of the metal layer 62. Polishing may be chemical mechanical polishing (CMP). Etch-back may be used instead of polishing. After the surface of the metal layer 62 is exposed, polishing or etch-back is further performed to obtain a flat surface 64.

A resist film is coated on the flat surface 64, and contact holes 65 and 66 exposing the source and drain regions 20S and 20D of the silicon thin film 20 are formed by photolithography or electron beam lithography and selective etching. The resist film is thereafter removed.

As shown in FIG. 6C, a metal layer is deposited on the substrate surface and patterned using photolithography or electron beam lithography to form source and drain electrodes 67 and 68 connected to the source and drain regions 20S and 20D and a gate extraction electrode 69 connected to the metal layer 62. The metal layer 62 and gate extraction electrode 69 constitute the control gate electrode.

With this structure, the metal layer 62 of the gate electrode can be formed in a self-alignment manner at the same time when the quantum box is formed. Therefore, the insulating film 61 can be formed sufficiently thin and the potential of the quantum box can be efficiently controlled by the control electrode. An insulating film having etching characteristics different from the insulating film 63 may be formed on the surface of the metal layer 62 to use it as an etching stopper layer.

In the above embodiments, one or more quantum boxes are disposed over the quantum wire, and if necessary a control electrode is disposed over the quantum box or boxes. The potential of each quantum box is desired to be positively controlled in some cases. An embodiment suitable for the control of the electric potential of the respective quantum boxes is described below.

Figure 7A:
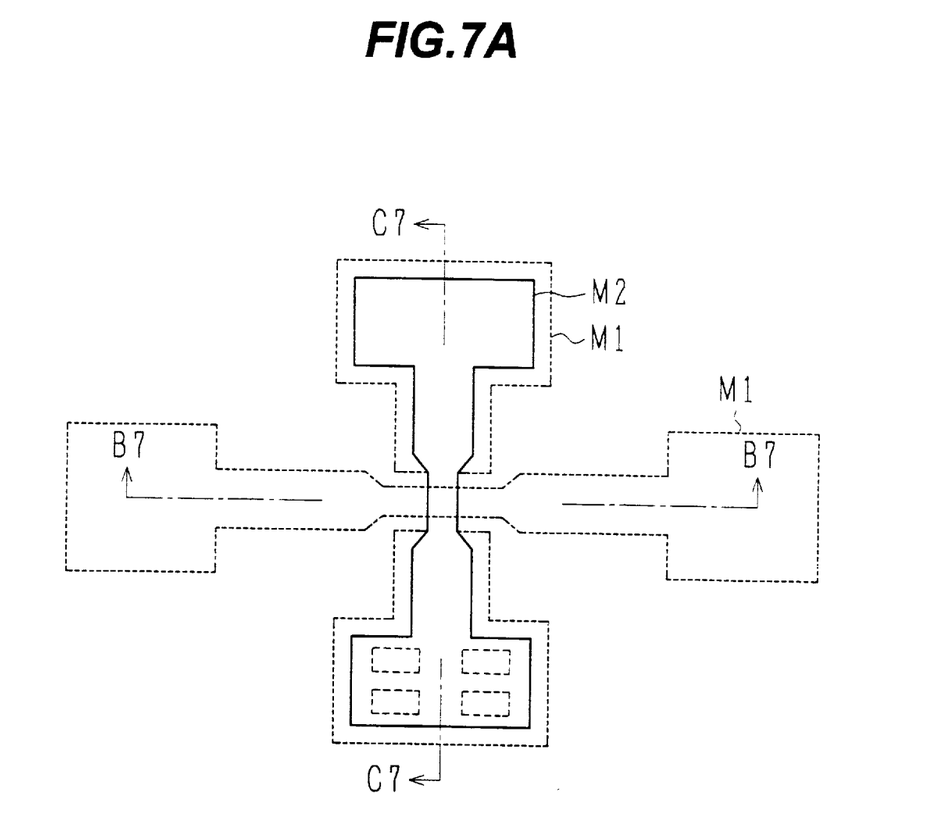
FIGS. 7A to 7C are a plan view and cross sectional views showing the structure of a semiconductor device according to another embodiment of the invention.
Figure 7B:
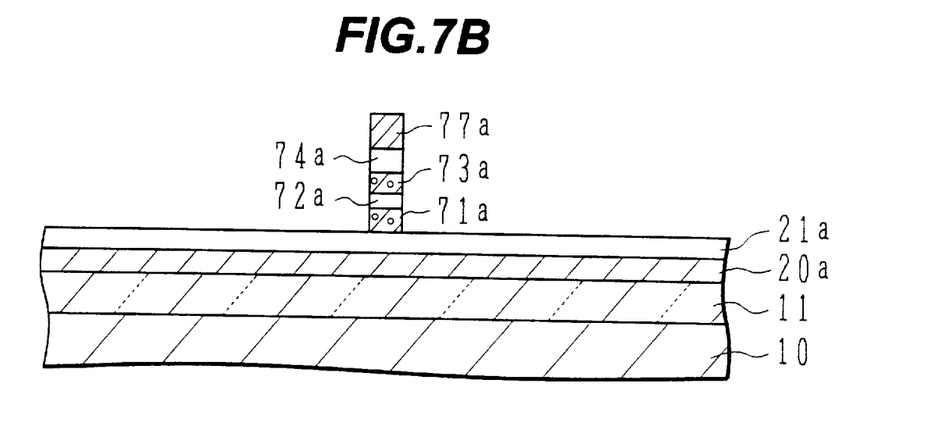
Figure 7C:
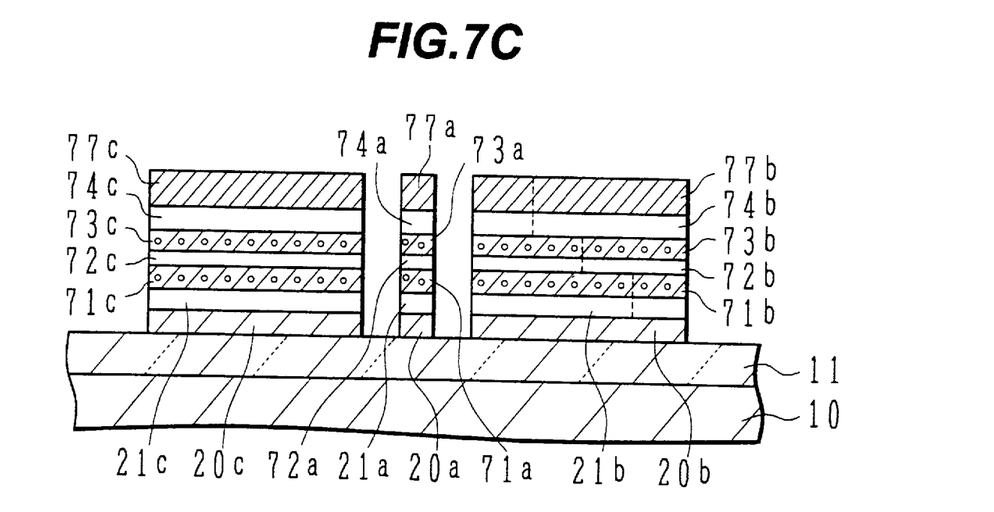

FIGS. 7A to 7C show the structure of a quantum box type semiconductor device according to another embodiment of the invention. In this embodiment, two quantum boxes are stacked. However, three or more quantum boxes may be stacked or a single quantum box may be used.

FIG. 7A is a schematic diagram of two masks used for the manufacture of the semiconductor device. A mask M1 is used for the first patterning process to etch the region from the substrate surface to the bottom of the quantum wire layer.

A mask M2 is used for the second patterning process to etch the region from the substrate surface to the surface of the insulating film on the quantum wire. The narrow stripe region for forming the quantum wire extends in the central area of the first mask M1 in the horizontal direction in FIG. 7A. A pattern for forming control electrodes, which control the potential of the quantum wire and boxes, is disposed at the upper and lower areas separated from the narrow stripe region as viewed in FIG. 7A.

The second mask M2 has a pattern for forming the quantum boxes above the quantum wire and control electrodes at the upper and lower areas of the quantum boxes, as viewed in FIG. 7A.

The cross section taken along line B7—B7 of FIG. 7A is shown in FIG. 7B, and that taken along line C7—C7 is shown in FIG. 7C.

FIG. 7B shows the cross sectional structure along the longitudinal direction of the quantum wire. A silicon oxide film 11 is formed on a silicon substrate 10. On the surface of the silicon oxide film 11, a single crystal silicon thin film 20a and a silicon oxide film 21a of narrow stripe shapes are formed respectively. The silicon thin film 20a constitutes the quantum wire. A polysilicon quantum box 71a, an insulating film 72a, a polysilicon quantum box 73a, an insulating film 74a, and a metal layer 77a are formed in a self-alignment manner on the silicon oxide film 21a. The cross sectional structure is basically the same as the above-described embodiments.

FIG. 7C shows the cross sectional structure along the direction crossing the structure shown in FIG. 7B. At the right and left sides of the single crystal silicon quantum wire 20a extending in the direction perpendicular to the drawing sheet, single crystal silicon layer patterns 20b and 20c are disposed spaced apart from the quantum wire 20a. Similarly, at both sides of the insulating layer 21a, insulating layer patterns 21b and 21c are disposed, and at both sides of the polysilicon quantum box 71a, polysilicon layer patterns 71b and 71c are disposed. Similarly, at both sides of the polysilicon quantum box 73a, polysilicon patterns 73b and 73c are disposed, and at both sides of the metal layer 77a, metal layer patterns 77b and 77c are disposed.

In operation of the quantum box type semiconductor device constructed as above, the potential of, for example, the metal layer 77a can be controlled by applying a predetermined potential to the metal layer patterns 77b and 77c. The potentials of the polysilicon layer patterns 73b and 73c, 71b and 71c can also be controlled by applying predetermined potentials to the metal layer patterns 77b and 77c, through capacitive coupling to the underlying polysilicon layer patterns. The potentials of the polysilicon layer patterns 73b and 73c, 71b and 71c then control the potentials of the quantum boxes 73a and 71a.

The potential of the quantum wire 20a can also be controlled by applying a predetermined potential to the single crystal silicon layer patterns 20b and 20c.

In order to control the potentials of the quantum wire and boxes by applying potentials directly to the single crystal silicon, polysilicon, and/or conductive patterns, etching is performed from the substrate surface to the subject pattern and an electrode is formed on this pattern. For example, the patterns 77b and 77c are etched leaving only the central regions thereof, the lower patterns 73b and 73c are exposed near or at the central regions and the outer regions are etched and removed, the further lower patterns 71b and 71c are exposed at the outer regions and the more outer regions are removed, and the patterns 20b and 20c are exposed at the outermost regions, as shown by broken lines in the righthand side of FIG. 7C. Alternatively, contact holes having different depths to subject patterns are formed in the pad areas as shown by the broken lines in the lower part of FIG. 7A to form contact electrodes of the subject patterns.

Also in this embodiment, after the structure including the quantum wire and boxes, a control electrode is formed, insulating material is deposited to cover the whole surface of the substrate, etched back, and polished to expose the surfaces of the metal layers 77a, 77b, and 77c and to thereafter form contact electrodes.

With the above structure, the potentials of the quantum wire and boxes can be controlled as desired to realize various circuit operations. In this embodiment, the control electrode structure is formed on both sides of the quantum wire and boxes. Alternatively, the control electrode structure may be formed on one side of the quantum wire and boxes.

Figure 8:
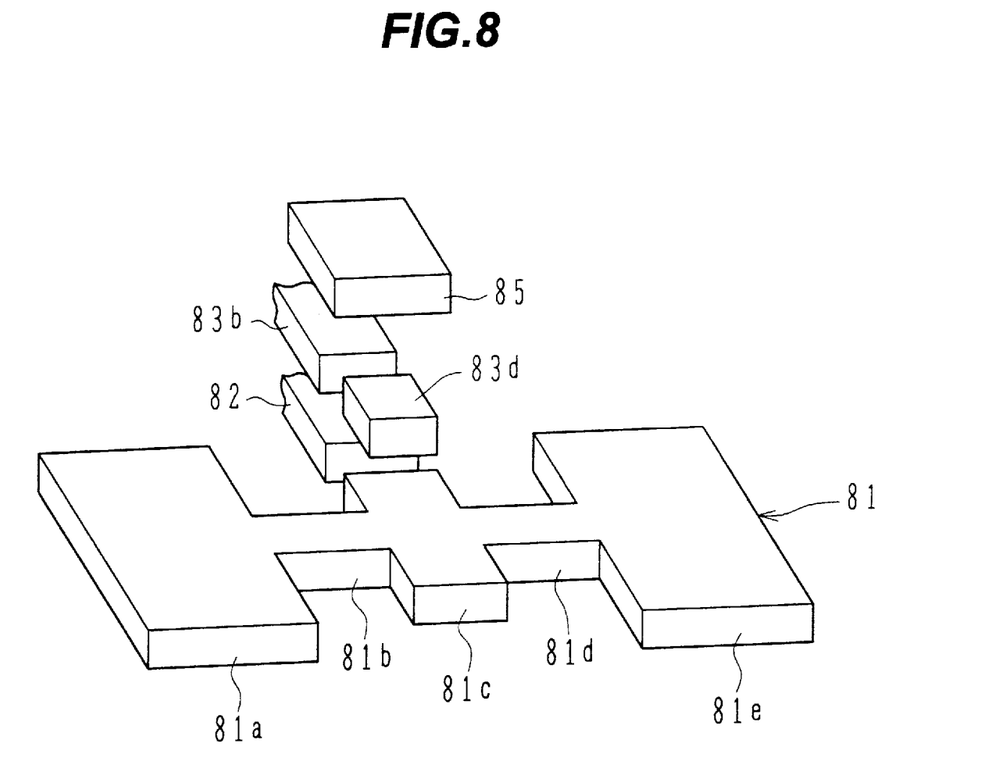
FIG. 8 is a schematic perspective view showing the structure of a semiconductor device according to another embodiment of the invention.

FIG. 8 is a schematic diagram showing the structure of a quantum box type semiconductor device according to another embodiment of the invention. A conductive layer 81 includes a source region 81a, a quantum wire region 81b, a wide quantum wire region 81c, a quantum wire region 81d, and a drain region 81e. The quantum wire regions 81b and 81d have generally the same width and generally the same energy levels. The central quantum wire region 81c is wide and has energy levels different from those of the quantum wire regions 81b and 81d at both sides of the quantum wire region 81c. A control electrode 82 is disposed adjacent to the quantum wire region 81c. By controlling the potential of the wide quantum wire region 81c by the control electrode 82, the relative energy levels of the quantum wire regions 81b and 81d and central quantum wire region 81c can be adjusted. A quantum box 83a is disposed over the central quantum wire region 81c. A control electrode 83b is disposed at the side of the quantum box 83a so that the potential of the quantum box 83a can be controlled. A control electrode 85 is disposed over the quantum box 83a and can control the potential of the quantum box 83a.

For example, a potential having a predetermined value relative to the potentials of the source region 81a and drain region 81e is applied to the control gate 85. As the potentials of the control electrodes 82 and 83b are controlled, the potentials of the quantum wire region 81c and quantum box 83a can be controlled. By controlling these potentials, electrons passing through the quantum wire regions can be controlled, and further electrons moving from the quantum wire regions to the quantum box 83a can be controlled. By controlling these potentials, the retention time of electrons once stored in the quantum box 83a can be prolonged.

The semiconductor device shown in FIG. 8 can be realized by changing the structure of the above embodiments, e.g., the structure shown in FIG. 7C.

In the above embodiments, a silicon SIMOX substrate is used. Other semiconductor materials may be used for the substrate. For example, a laminated substrate similar to FIG. 1A may be formed by laminating low resistance GaAs and high resistance AlAs on a GaAs substrate.

In the above embodiments, semiconductor devices having a quantum wire and boxes have been described. A semiconductor device having a fine wire region and micro box regions can be realized by using the structure and manufacture processes similar to the above embodiments. For example, a single electron tunneling device can be realized which shows an energy level change larger than the thermal energy in an isolated region when one electron is stored in the isolated region.

The present invention has been described in connection with the preferred embodiments. The invention is not limited only to the above embodiments. It will be apparent to those skilled in the art that various modifications, improvements, combinations and the like can be made within the scope of this invention.

What is claimed is:

1. A semiconductor device comprising:
   a substrate having an insulating surface;
   a fine wire region made of a conductive semiconductor material, elongated along one direction, and disposed on the insulating surface of said substrate;
   a first insulating film of a planar shape formed at least on part of said fine wire region and having first side edges; and
   a first micro box region made of a conductive semiconductor material, formed on said first insulating film on said fine wire region;
   wherein said fine wire region has a portion indented with respect to said first side edges of the first insulating film.

2. A semiconductor device according to claim 1, further comprising:
   a second insulating film formed over said substrate, covering said first micro box region and said fine wire region; and
   a control gate electrode of conducting material formed on said second insulating film, covering an area corresponding to said first micro box region.

3. A semiconductor device according to claim 2, wherein said second insulating film includes a sub-layer disposed directly on said first micro box region and having second side edges defining a planar shape, and said first micro box region has side edges indented with respect to said second side edges of the sub-layer.

4. A semiconductor device according to claim 1, further comprising:
   a laminated structure including one or more laminates of an insulating film and a second micro box region, stacked repetitively on said first micro box region in a thickness direction of said substrate.

5. A semiconductor device according to claim 1, further comprising:
   a control electrode disposed at a side of, and separated from, said fine wire region or said first micro box region.

6. A semiconductor device according to claim 1, further comprising:
   a laminated structure including a lamination of an insulating layer and a conductive layer disposed on said first micro box region, said laminated structure being aligned with said first micro box region.

7. A semiconductor device comprising:
   wire means for conducting a charge in a first direction;
   box means for storing a charge;
   an insulator of a planar shape, interposed between said wire means and said box means and having a width wider than those of said wire means and said box means; and
   electrode means for inducing a charge conducted by said wire means to tunnel through said insulator to be stored in said box means.

8. A semiconductor device as claimed in claim 7, wherein said wire means is responsive to the storing of a single electron in said box means.

9. A semiconductor device as claimed in claim 8, wherein said wire means conducts a different current value with a same voltage value applied across said wire means in response to the storing of a single electron in said box means.

10. A semiconductor device as claimed in claim 7, wherein said wire means conducts a current when a first voltage is applied across said wire means and said box means stores no charge and said wire means does not conduct a current when said first voltage is applied across said wire means and only a single electron is stored in said box means.

11. A semiconductor device according to claim 7, further comprising a cap insulator plate disposed on said box means and having a width and length larger than those of said box means.

12. A semiconductor memory device comprising:
   a substrate having an insulating surface; and
   a plurality of bit storage areas, each bit storage area including
      a fine wire region made of a conductive semiconductor material, elongated along one direction, and disposed on the insulating surface of said substrate;
      a first insulating film formed at least on part of said fine wire region having a planar shape elongated along said one direction and a pair of first side edges extending along said one direction;
      a first micro box region made of a conductive semiconductor material, formed on said first insulating film on said fine wire region;
      a first electrode formed over said micro box region;
      a second electrode electrically connected to a first end of said fine wire region; and
      a third electrode electrically connected to a second end of said fine wire region;
   wherein said pair of first side edges are disposed outside of widths of said fine wire region and said first micro box region.

13. A semiconductor memory device according to claim 12, wherein each of said bit storage area further includes:
   a second insulating film formed over said substrate, covering said first micro box region and said fine wire region; and wherein
   said first electrode includes conducting material formed on said second insulating film, covering an area corresponding to said first micro box region.

14. A semiconductor memory device according to claim 12, wherein each of said bit storage area further includes:
  a laminated structure including one or more laminates of an insulating film and a second micro box region, stacked repetitively on said first micro box region in a thickness direction of said substrate.

15. A semiconductor memory device according to claim 12, wherein each of said bit storage area further includes:
  a laminated structure including a lamination of an insulating layer and a conductive layer disposed on said first micro box region, said laminated structure being aligned with said first micro box region.

16. The semiconductor memory device of claim 12, wherein said fine wire region has a width of 25 nm or less.

17. The semiconductor memory device of claim 12, wherein said microbox region has a width and a length of 25 nm or less.

18. The semiconductor memory device according to claim 12, further comprising a cap insulator plate disposed on said first micro box region and having a width the same as that of said first insulating plate between said pair of first side edges.

* * * * *